(12) United States Patent
Somasekhar et al.

(10) Patent No.: US 6,567,329 B2
(45) Date of Patent: May 20, 2003

(54) MULTIPLE WORD-LINE ACCESSING AND ACCESSOR

(75) Inventors: Dinesh Somasekhar, Hillsboro, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/941,053

(22) Filed: Aug. 28, 2001

(65) Prior Publication Data

US 2003/0043667 A1 Mar. 6, 2003

(51) Int. Cl.[7] .................................................. G11C 7/02
(52) U.S. Cl. ...................................... 365/207; 365/149
(58) Field of Search ................................ 365/207, 149, 365/63, 230.03, 230.06

(56) References Cited

U.S. PATENT DOCUMENTS

| | | | | |
|---|---|---|---|---|
| 5,097,441 A | * | 3/1992 | Cho et al. ............... | 365/230.06 |
| 5,155,700 A | * | 10/1992 | Min et al. ................. | 365/206 |
| 5,732,010 A | * | 3/1998 | Takashima et al. .... | 365/189.08 |
| 6,034,879 A | * | 3/2000 | Min et al. .................. | 365/214 |
| 6,212,597 B1 | | 4/2001 | Conlin et al. | |
| 6,215,706 B1 | | 4/2001 | Harrand et al. | |
| 6,219,294 B1 | | 4/2001 | Huber et al. | |
| 6,222,275 B1 | | 4/2001 | Keeth | |
| 6,229,169 B1 | | 5/2001 | Hofmann et al. | |

OTHER PUBLICATIONS

Intel, PC SDRAM Specification, Revision 1.7, Nov. 1999. pp. 66.

* cited by examiner

Primary Examiner—Michael S. Lebentritt
Assistant Examiner—Anh Phung
(74) Attorney, Agent, or Firm—Blakely, Sokoloff, Taylor & Zafman LLP

(57) ABSTRACT

The word-lines and/or bit-lines in a memory are physically arranged to reduce capacitive coupling between signal lines and reference lines. In one embodiment the two bit lines connected to a single sense amplifier are physically separated from each other by bit lines connected to other sense amplifiers. In another embodiment the word-lines are separated from each other by placing them in different metallization layers. In a particular embodiment a single word-line has different portions disposed in different metallization layers.

19 Claims, 6 Drawing Sheets

MULTIPLE WORD-LINE ACCESSING AND ACCESSOR

FIELD OF INVENTION

The present invention is in the field of memory device architecture. More particularly, the present invention provides a method, apparatus, system, and machine-readable medium to use a set of word-lines to access a row of memory cells.

BACKGROUND

A modern dynamic random access memory (DRAM) memory cell or memory bit comprises one transistor and one capacitor. The transistor operates as a switch between the capacitor and the bit-line and can be activated or deactivated by a word-line coupled to the base of the transistor. The memory cell can store binary information as a charge on the capacitor and the charge can be sensed by a sense amplifier comparing a bit-line acting as a signal bit-line and a bit-line acting as a reference bit-line. The binary information may be represented by positive or negative $(V_D-V_{SS})/2$ volts across the capacitor to combine with a pre-charge on a bit-line of positive $(V_D-V_{SS})/2$, where $V_D$ is a high voltage representing one binary bit and $V_{SS}$ is a low voltage representing a second binary bit.

Based on the spatial location of reference bit-lines to signal bit-lines, DRAM array organizations may be divided into at least two architectures: folded bit-line and open bit-line. Both the folded bit-line architecture and the open bit-line architecture have advantages and disadvantages. The folded bit-line architecture may comprise memory cells on a given word-line, coupled to every other bit-line so signal bit-lines are coupled a memory cell and are separated from other signal bit-lines by reference bit-lines. An advantage of this architecture is that it places the signal bit-line and reference bit-line in close proximity for good matching at the expense of a larger, less spatially efficient array layout. Consequently, the folded bit-line architecture has a low signal bit-line coupling, resulting in a low signal to noise ratio and the sense amplifiers can be pitched every four bit-lines, or quarter pitched, when alternate sense amplifiers are placed on either side of a memory bank. A disadvantage, however, is that separating active bit-lines by reference bit-lines can cause the coupling capacitance between adjacent bit-lines to be a large fraction of overall capacitance of a bit-line. In particular, when the signal bit-lines on either side of a reference bit-line read one or zero, the voltage on the reference bit-line moves in a like direction and the voltage differential between a signal bit-line and the reference bit-line may be reduced. A reduced voltage differential may increase read cycle (RC) delay.

In contrast to the folded bit-line architecture, the open bit-line architecture comprises spatially separated signal and reference bit-lines, facilitating a more compact cell. Since the bit-lines are adjacent, however, bit-line noise from capacitive coupling may be high and bit-line to word-line noise from capacitive coupling may contribute to the overall noise, particularly when the bit-line is operating as a signal bit-line during amplification and write-back. More importantly, during the write-back phase, when placing the charge back on the memory cell, the sense amplifier, driving a full swing signal into the cell, may cause the adjacent signal bit-line and reference bit-line to swing in opposite directions. For example, when all signal bit-lines read out zero, the reference bit-lines will be driven high during the write-back phase. Then, the reference bit-lines can induce a voltage on the word-lines of non-selected memory banks, causing the non-selected memory cells in the non-selected memory banks to be weakly activated. Activating non-selected memory cells can drain charge and the extent of the drainage may depend upon the severity of the coupling.

BRIEF DESCRIPTION OF THE DRAWINGS

In the accompanying drawings, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments. The variations of embodiments anticipated for the present invention are too numerous to discuss individually so the detailed descriptions below are designed to make such embodiments obvious to a person of ordinary skill in the art.

Figure 1:
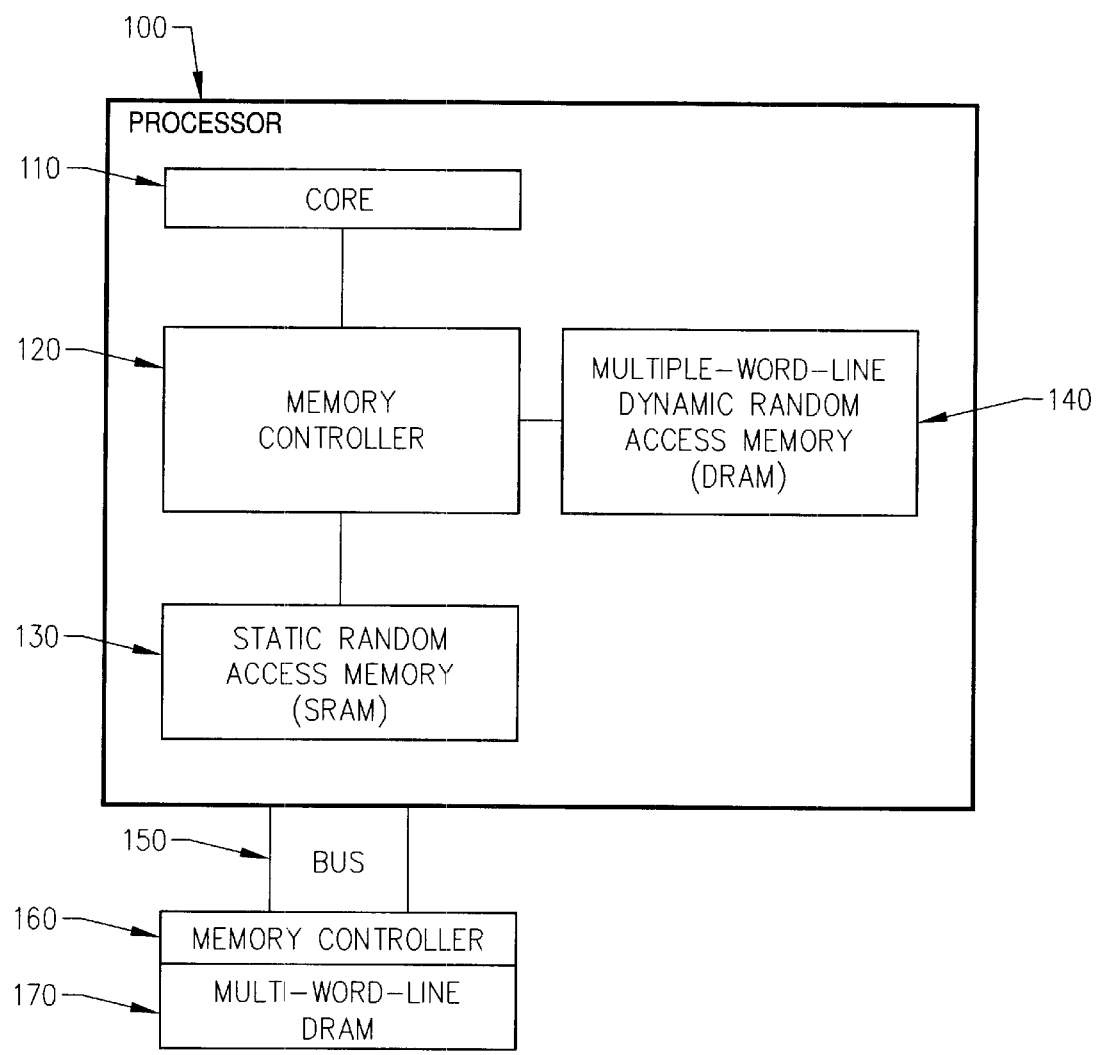
FIG. 1 depicts a processor comprising embedded multiple-word-line memory and coupled to a multiple-word-line memory via a bus.

Referring now to FIG. 1, there is shown an apparatus comprising a processor 100 having an internal memory and coupled to an external memory via bus 150. Processor 100 comprises a core 110, a memory controller 120, a static random access memory (SRAM)) 130, and a multiple-word-line dynamic random access memory (DRAM) 140. The processor 100 may be coupled to the multiple-word-line DRAM 170 via bus 150 and memory controller 160. The multiple-word-line DRAM 170 may comprise a large number of memory cells in a small area. For example, the memory cell may comprise four feature size squared and the total memory array of multiple-word-line DRAM 170 may comprise 1 gigabyte.

The density of multiple-word-line DRAM 170 may be particularly suitable for applications such as notebook computers or laptop computers, palm pilot computers, cellular phones with database or internet access, or cellular phones comprising features such as phone book, address book, caller ID, etc. The density of multiple-word-line DRAM 170 may be contributed to a memory cell being located at each intersection of a row with a bit-line such as open bit-line architecture. However, the multiple-word-line DRAM 170 may comprise reference bit-lines within the same bank like the folded bit-line architecture.

The multiple-word-line DRAM 170 may comprise sense amplifiers wherein each sense amplifier is coupled to two bit-lines of the memory array. One bit-line may couple to a first group of memory cells of a row of memory cells and the second bit-line may couple to a second group of the row. The row may be coupled to a set of word-lines and each group of the row may be coupled to a different word-line and non-conductive material may separate each word-line. Thus, a signal bit-line may be compared to a reference bit-line within the same memory bank by attaching the signal bit-line of the sense amplifier to a group comprising a selected memory cell and attaching the reference bit-line to a group comprising non-selected memory cells in the same row. As a result, groups in the row may be independently selectable from other groups.

Multiple-word-line DRAM 170 may also comprise circuitry to refresh the memory cells. The circuitry may use a pointer to track banks of memory cells to refresh. The pointer may advance to each subsequent bank in an order in response to refreshing a current bank. In addition, the circuitry to refresh the memory cells may comprise a counter or timer to track the time available before refreshing a memory bank. In some embodiments, the circuitry to refresh may further comprise circuitry to begin a refresh cycle when the memory bank to be refreshed is not being accessed or is not being repeatedly accessed.

The memory controller 160 may facilitate access to the multiple-word-line DRAM 170 by the processor 100. In some embodiments, the memory controller 160 may coordinate access of the multiple-word-line DRAM 170 and other data storage mediums by processor 100 or by other agents coupled to bus 150.

Processor 100 may comprise a core 110 to execute a general application or specific application code and may use the SRAM 130 and the DRAM 140 to store code, or other software, and variables during execution of the code. More specifically, the core 110 may access SRAM 130 and DRAM 140 via memory controller 120. Memory controller 120 may coordinate data and code storage between SRAM 130 and multiple-word-line DRAM 140 such that code and data being accessed more frequently by core 110 is stored in SRAM 130. In alternative embodiments, processor 100 may comprise multiple-word-line DRAM 140 without a corresponding SRAM 130.

Processor 100 may comprise embedded multiple-word-line DRAM 140 to store a large amount of code and data in the processor. Storing a large amount of code and data may reduce latencies involved with accessing data storage outside the processor 100.

Multiple-word-line DRAM 140 may comprise an array of memory cells organized in rows and columns. Each memory cell may comprise a transistor and a capacitor. A transistor may be coupled to a set of word-lines that couples a plurality of memory cells to a row. The word-line may turn off and on the transistor of each attached memory cell like a switch. The transistor may couple a capacitor of a memory cell to a bit-line when the transistor is on and decouple the capacitor from the bit-line when the transistor is off. The second lead of the capacitor may be coupled to a power supply node such as $V_{SS}$. In alternative embodiments, the memory cell may comprise a data storage element or device other than the capacitor and may comprise more than one transistor. In some alternate embodiments, the second lead of the capacitor may be coupled to $V_D$.

Bit-lines of the multiple-word-line DRAM 140 may couple the memory cells in columns and a sense-amplifier may be coupled to the bit-line to sense the amount of charge stored in a capacitor of a memory cell when the transistor of the memory cell is turned on. For example, a memory cell may be read by applying a voltage to the word-line attached to the transistor of the memory cell. The voltage may turn the transistor on, allowing charge in the memory element of the memory cell to combine with the charge on the bit-line. Then, a sense-amplifier attached to the bit-line of the memory cell may sense a voltage on the bit-line as affected by the charge in the capacitor of the memory cell being read, and compare that charge to a reference charge. The sense-amplifier may then output $V_D$ or $V_{SS}$ depending upon the result of the comparison. In some embodiments, the bit-line is pre-charged to enable the transistors coupled to the bit-line. Some of these embodiments pre-charge the bit-line to half $V_D$, reducing the current used by the memory array to reduce power dissipation.

The set of word-lines defining each row in a memory array may further define groups of memory cells within each row, allowing a group of memory cells or a memory cell within a row to be selected for access while other memory cells in that row remain non-selected, or are deselected. The set of word-lines may comprise more than one word-line, substantially isolated by a non-conductive material, to couple to memory cells in that row. In some embodiments, the set of word-lines may comprise a pair of word-lines separated by a substantially non-conductive material. The first word-line may be coupled to odd numbered memory cells in a row and the second word-line may be coupled to even number memory cells in the same row.

In other embodiments, a first word-line may couple to 8 memory cells in a row, a second word-line may be coupled to the next 8 memory cells in a row, the third memory line may be coupled to the next 8 memory cells in a row, etc. In still further embodiments, the first word-line may be coupled to 16 memory cells in a row and the second word-line may be coupled to the next 16 memory cells in a row. In this latter embodiment, the first word-line may not run the entire length of the row.

The word-lines of the set of word-lines may be located in the same horizontal layer of conductive material on a semiconductor chip and/or may reside in different layers, vertically separated by layers of non-conductive material. In some embodiments, the set of word-lines may comprise a vertical twist to facilitate coupling of the set of word-lines to alternating memory cells. For example, when a set of word-lines comprises two word-lines located in the same horizontal layer of conductive material such as metal layer 2 and the word-lines alternate between coupling to groups of 8 memory cells each throughout the row, a vertical twist of the word-lines such as is shown in FIG. 6b and a horizontal shift of the second word-line such as is shown in FIG. 6a may swap the physical locations of the first word-line and the second word-line between each group of 8 memory cells while maintaining the separation by a non-conductive material.

Figure 6A:
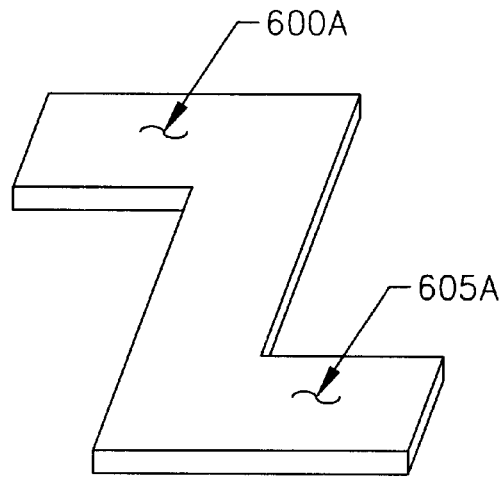
FIG. 6a depicts an embodiment of a horizontal shift.
Figure 6B:
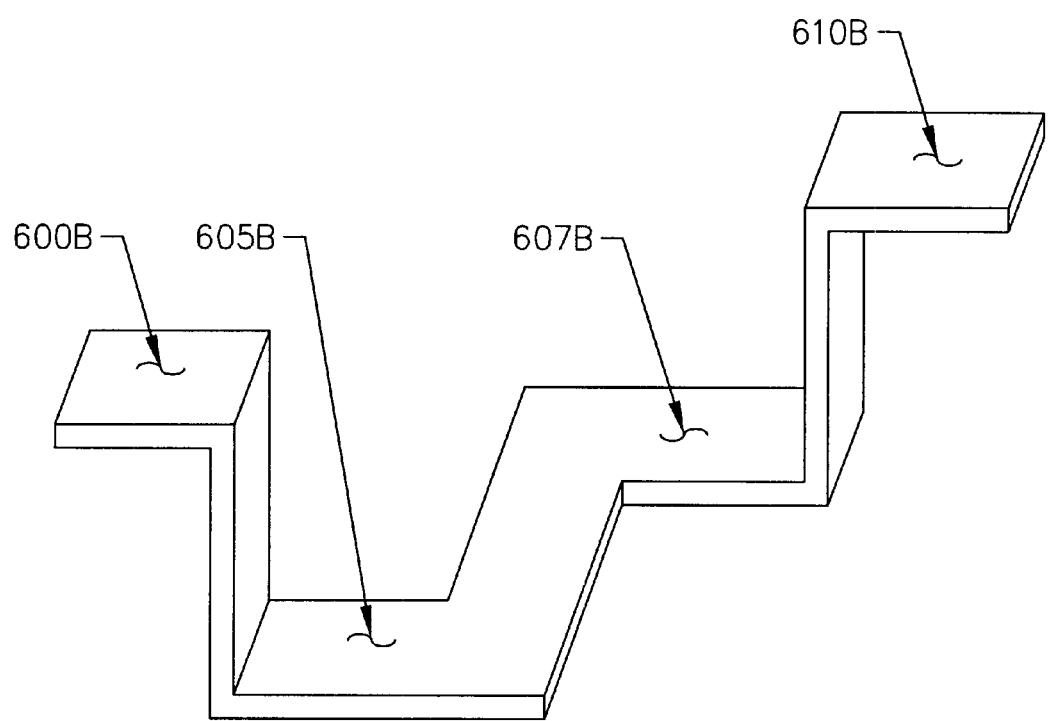
FIG. 6b depicts an embodiment of a vertical twist.

Referring now to FIGS. 6a and 6b, a vertical twist may be accomplished by shifting a first word-line to a conductive layer below 600B to 605B such as metal layer 3 (or a conductive layer above such as metal layer 1), running the first word-line to the new location 605B to 607B in metal layer 3, and returning the first word-line to its new location 610B in metal layer 2. The second word-line may be shifted from a first location 600A to a second location 605A in metal layer 2 in the space made available in metal layer 2 by shifting the first word-line in metal layer 3. Alternatively, both the first word-line and the second word-line may be shifted with a vertical twist.

Referring again to FIG. 1, sense amplifiers may be coupled to bit-lines at quarter pitch (every 4 bit-lines) when located on both sides of the memory array or half-pitch (every 2 bit-lines) when located on one side of the memory array. A sense amplifier may couple to a first bit-line of a first memory cell coupled to a first word-line and couple to a second bit-line of a second memory cell coupled to a second word-line wherein the first memory cell and second memory cell reside in the same row. Thus, the sense amplifier may compare a signal bit-line of a selected memory cell to a reference bit-line of a non-selected memory cell in that same row, reducing noise introduced by capacitive coupling between a signal bit-line, reference bit-line, and the word-lines during write-back. For instance, during write-back, a voltage of $V_{SS}$ may be applied to the signal bit-line and a voltage of $V_D$ may be applied to the reference bit-line. Capacitive coupling between the signal bit-line and the word-lines may cancel out or substantially cancel capacitive coupling between the reference bit-lines and the word-lines. A horizontal shift or vertical twist of the leads between adjacent sense amplifiers may facilitate the cancellation and may further reduce bit-line-to-bit-line coupling by increasing the distance between reference bit-lines and signal bit-lines.

In some embodiments, the conductive layer where each bit-line resides may be alternated to further reduce signal bit-line to signal bit-line coupling. For example, a first selected memory cell may be coupled to a bit-line in a first conductive layer and an adjacent selected memory cell may be coupled to a bit-line in a third conductive layer. Many embodiments employ a vertical shift or vertical twist in the bit-line, such as at a midpoint of each bit-line, for symmetry.

Figure 2:
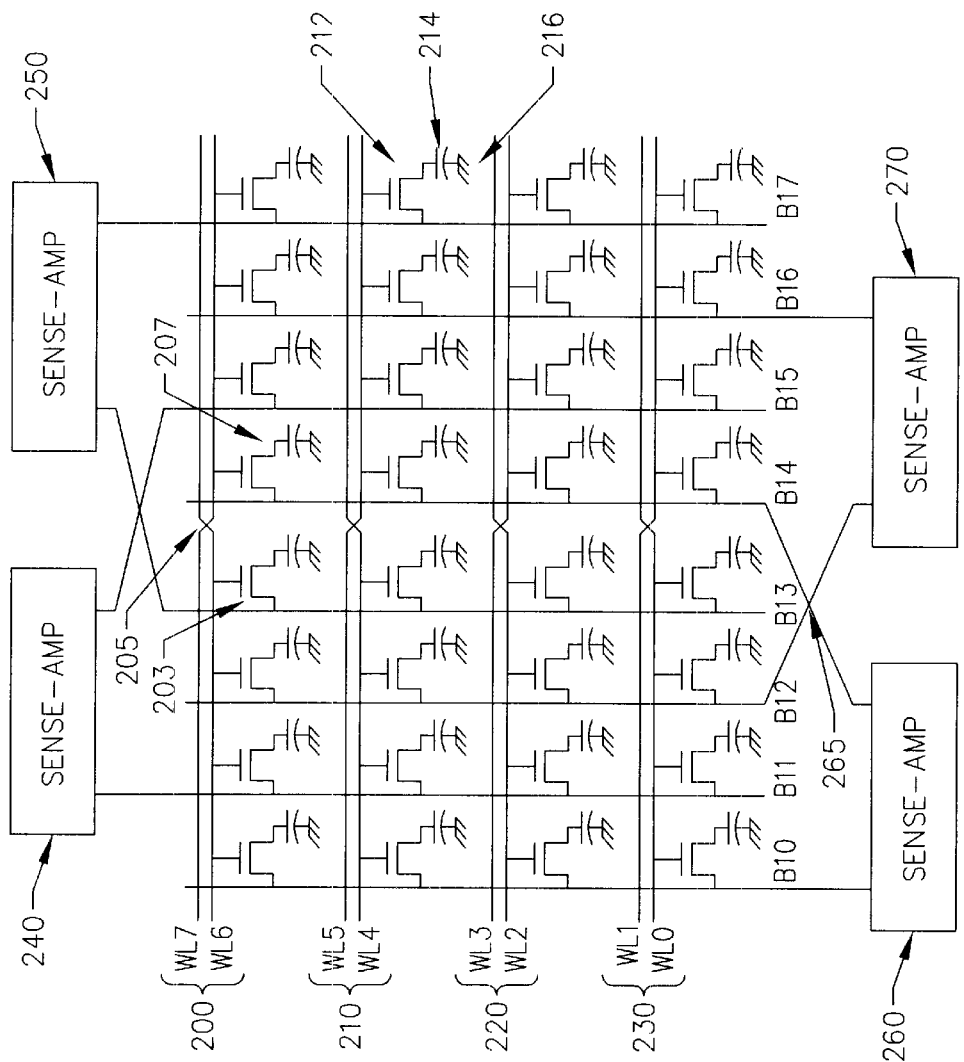
FIG. 2 depicts an embodiment of multiple-word-line memory.

Referring now to FIG. 2, there is shown an embodiment of a multiple word-line memory. The embodiment comprises four sets of word-lines 200, 210, 220, and 230 coupling memory cells, such as memory cell 203 and memory cell 207, of the memory array in rows and bit-lines BL0 through BL7 coupling the memory cells of the memory array in columns. The embodiment further comprises sense-amplifiers 240, 250, 260, and 270 to access and refresh memory cells.

Each memory cell may comprise a transistor such as transistor 212 and a capacitor such as capacitor 214. The gate of the transistor 212 may be coupled to a set of word-lines such as the set of word-lines 210 and to a bit-line such as BL7 to access the memory cell. A voltage may be applied to the gate of the transistor via the set of word-lines 210, turning on the transistor 212, to create a conductive path between the capacitor 214 and bit-line BL7. In addition, the other side of the capacitor may be coupled to a reference voltage 216, such as $V_{SS}$.

The sets of word-lines of the present embodiment each comprise two word-lines. For example, set of word-lines 200 comprises word-line 6 (WL6) and word-line 7 (WL7). WL6 couples to a first four memory cells of the row defined by set of word-lines 200 and WL7 couples to a second four memory cells of the same row. Each set of word-lines such as set of word-lines 200 comprises a word-line shift such as word-line shift 205 to facilitate coupling a second word-line such as WL7 to the second four memory cells. The physical configuration of the word-line shift 205 is dependent upon the physical configuration of the set of word-lines 200. For example, when WL6 and WL7 are located in the same horizontal layer of a semiconductor device, the word-line shift 205 may comprise a vertical twist of both word-lines or a vertical twist of one word-line and a horizontal shift of the second word-line. In some embodiments comprising more than two word-lines, two word-lines may vertically or horizontally shifted at a time or all word-lines may be shifted at the same time.

Referring now to FIG. 6a and FIG. 6b, the vertical twist may comprise shifting WL7 from a first layer 600B to a conductive layer below 605B the first layer and shifting WL7 back to the first layer in a new location 610B. WL6 may be horizontally shifted. Horizontal shifting may comprise shifting WL6, for example, within a single conductive layer 600A to 605A. In some embodiments, the word-line shift may occur between each memory cell and in other embodiments, the word-line shift may occur between every 16 memory cells, depending upon the application.

Referring again to FIG. 2, bit-lines may also alternate between conductive layers. For example, BL0 may be located in conductive layer 3, BL1 may be located in conductive layer 1, BL2 may be located in conductive layer 3, BL3 may be located in conductive layer 1, etc. Alternating conductive layers of adjacent bit-lines may increase the distance between signal bit-lines, reducing the capacitive coupling between the signal bit-lines. In further embodiments, the bit-lines may also alternate between layers from row-to-row or from a group of rows to a second group of rows. For example, BL0 may be located in metal layer 3 at sense-amplifier 260 and shift to metal layer 1 after set of word-lines 220 such that set of Word-lines 210 and 200 cross BL0 where BL0 is located in metal layer 1.

Sense-amplifier pairs such as sense-amplifier 240 and sense-amplifier 250 or sense-amplifier 260 and sense-amplifier 270 may further comprise a bit-line shift such as bit-line shift 265. Sense-amplifiers 240, 250, 260, and 270 are located quarter-pitch on either side of the memory array, or every 4 bit-lines. The bit-line shift 265 and quarter pitch may facilitate coupling each sense amplifier to two different groups for sensing. For example, when the four memory cells coupled to WL0 and BL1, BL2, BL3 and BL4 are enabled, and sense-amplifier 240 is enabled, a bit-line shift 265 from BL2 to BL4 may facilitate the use of a bit-line within the same array as a reference bit-line, reducing charge leakage from non-selected memory cells. The bit-line shift for the sense-amplifier pairs may also be accomplished by a vertical twist or the bit-lines such as BL2 and BL4 may be on different conductive layers allowing the bit-line shift without a vertical twist.

In some embodiments, sense-amplifiers 240, 250, 260 and 270 comprise independent outputs. The independent outputs may facilitate reading a group of memory cells at substantially the same time. For example, after WL0 enables memory cells coupled to BL0, BL1, BL2, and BL3, sense-amplifiers 240, 250, 260 and 270 may sense BL0, BL2, and BL3, respectively. The sense amplifiers 240, 250, 260 and 270 may then amplify the charge sensed, write-back the charge to the memory cells coupled to BL0, BL1, BL2, and BL3, and output the amplified charge via the independent outputs. Thus, four bits of data stored in the four memory cells may be read at the same time or substantially the same time. In other embodiments, more than one of the sense amplifiers may share an output.

Figure 3:
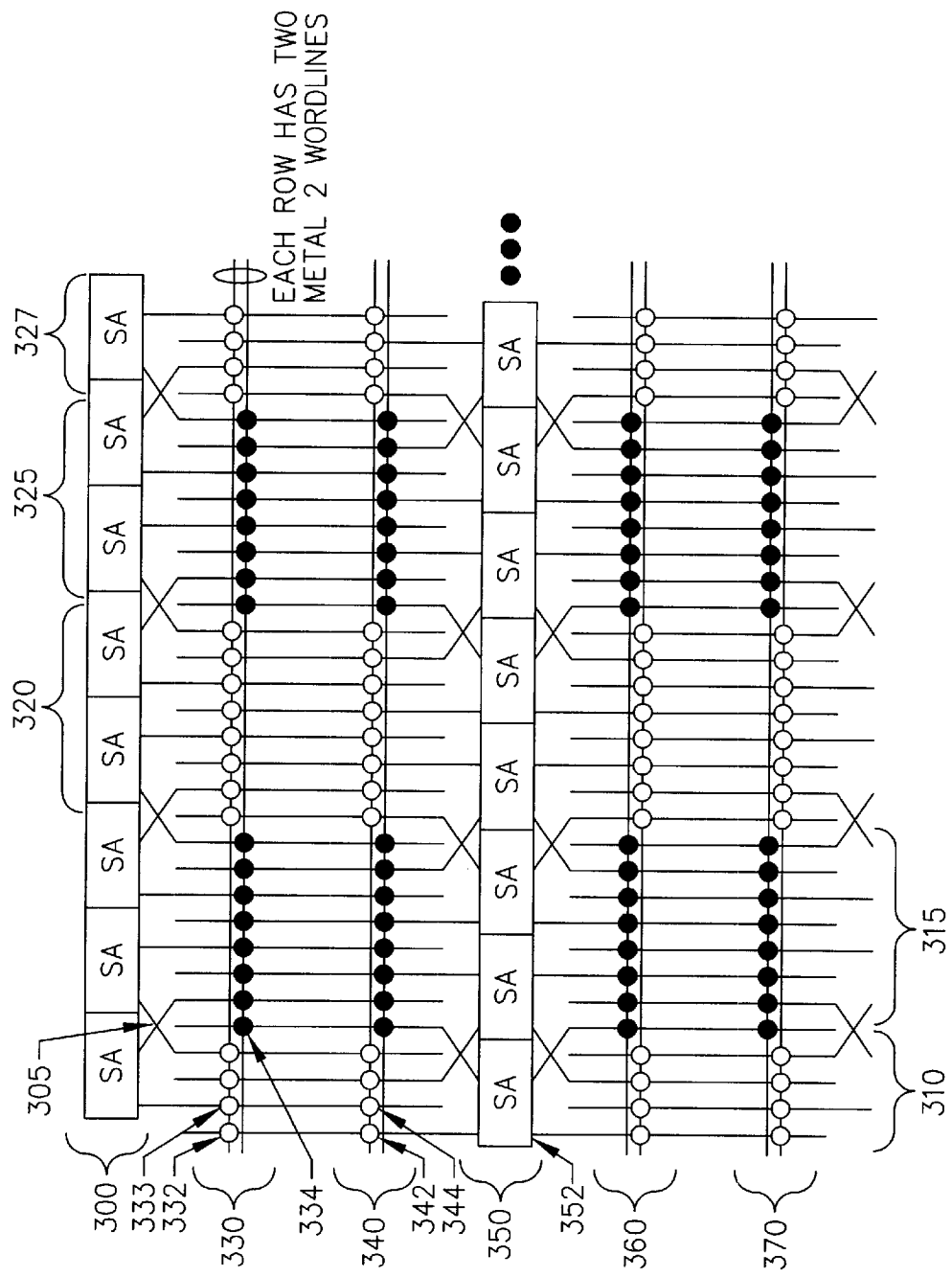
FIG. 3 depicts an embodiment of multiple-word-line memory.

Referring now to FIG. 3, there is shown a multiple word-line memory array. The multiple word-line memory array comprises sense amplifiers 300 and 350 coupled to bit-lines at quarter-pitch on either side of the memory array and sets of word-lines 330, 340, 360, and 370. Each set of word-lines 330, 340, 360 and 370 comprises two metal word-lines that define two groups of 16 memory cells in each row. In FIG. 3, white dots, such as shown at 333, in a row indicate a coupling between a memory cell and a first word-line and the black dots, such as shown at 334, indicate a coupling between the memory cell and the second word-line of the set of word-lines coupled to the row. For symmetry in the memory array, each set of word-lines may begin with four memory cells coupled to a first word-line and end with four memory cells coupled to the first word-line, e.g. groups 310 and 327. Further, groups 310 and 327 facilitate a bit-line shift between the first pair of sense amplifiers and last pair of sense amplifiers in the memory array.

The bit-line shift 305 may allow the first pair of sense amplifiers 300 to couple to a signal bit-line in a selected group of memory cells and a reference bit-line in a non-selected group of memory cells. For example, a first group of memory cells indicated by white dots coupled to set of word-lines 330 may be selected, groups 310, 320, and 327. Applying a voltage to the first word-line of multiple word-line 330 may turn on the access transistors of the memory cells. Memory cell groups 315 and 325 may be coupled to the second word-line of set of word-lines 330 and may remain non-selected. Sense amplifier 352 may sense a charge stored in the memory cell 332 and compare that charge to a reference bit-line coupled to a non-selected memory cell 334. Reading memory cell 332 may discharge the capacitor of memory cell 332 so sense-amplifier 352 may recharge memory cell 332 by writing back an amplified charge.

Writing-back a charge may involve sense-amplifier 352 applying a voltage differential to the signal and reference bit-lines for memory cell 332 substantially equivalent to the voltage difference between $V_D$ and $V_{SS}$. The non-selected memory cell 334, however, may not store a new charge because non-selected memory cell 334 may not have sufficient voltage coupled to its word-line to turn on the access transistor of memory cell 334. In some embodiments, sense-amplifier 352 may be capable of writing-back more than two different charge levels when the memory cell may store more than one bit of data at a time. In addition, many embodiments may be capable of writing-back positive and/or negative charges.

In several embodiments, sets of word-lines 330, 340, 360 and 370 may comprise vertical twists between memory cell groups 310, 315, 320, 325, and 327. Sets of word-lines 330, 340, 360 and 370 may comprise two metal word-lines on the same conductive layer of a semiconductor device and the vertical twist can allow each word-line of a set of word-lines to shift physical location while maintaining a separation from other word-lines by a non-conductive material. For example, set of word-lines 330 may comprise a vertical twist between memory cell groups 310 and 315 wherein a first word-line couples to a conductive layer above the conductive layer of the set of word-lines and the second word-line couples to a conductive layer below the conductive layer of the set of word-lines. The first word-line and second word-line are then coupled back to the layer of the set of word-lines 330 in shifted positions.

In some embodiments, the bit-line coupled to memory cells 332 and 342 may comprise a vertical shift between memory cells 332 and 342. Further, the bit-line coupled to memory cell 344 may be at a different conductive layer than the bit-line coupled to memory cell 342 at memory cell 342. For example, at memory cell 332, the bit-line coupled to memory cell 332 may be on a first conductive layer of the memory array and after a vertical shift between memory cell 332 and memory cell 342, the bit-line coupled to memory cells 332 and 342 at memory cell 342 may be located in a second conductive layer. The bit-line coupled to memory cells 333 and 344 may be located in the first conductive layer at memory cell 344, comprise a vertical shift, such as where the bit-line shifts from metal layer one to metal layer three or vice versa, between memory cell 344 and memory cell 333, and be located in a second conductive layer at memory cell 333.

Figure 4:
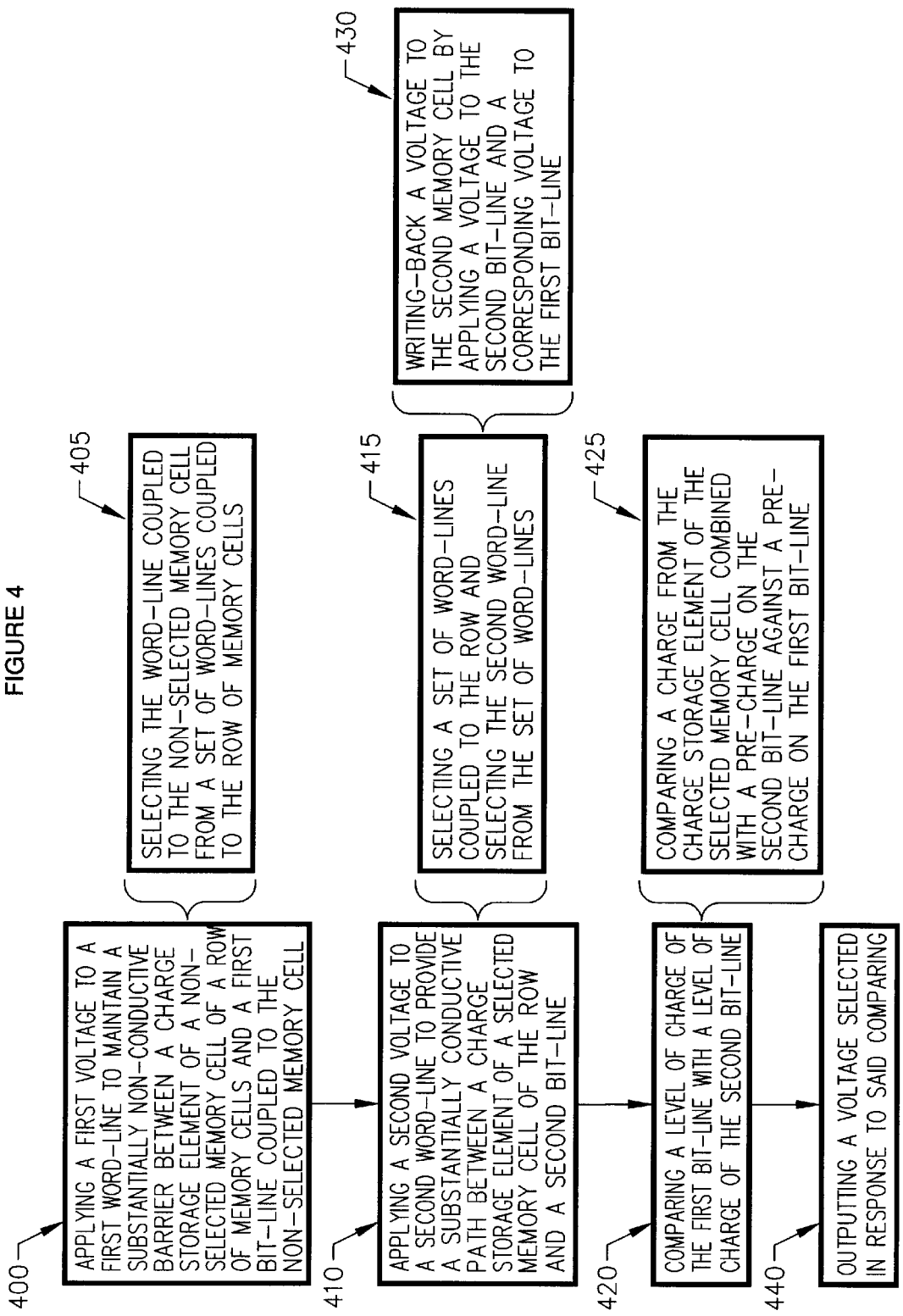
FIG. 4 depicts a flowchart of embodiments to access multiple-word-line memory.

Referring now to FIG. 4, there is shown a flow chart of embodiments to access multiple word-line memory. The flow chart comprises applying a first voltage to a first word-line to maintain a substantially non-conductive barrier between a charge storage element of a non-selected memory cell of a row of memory cells and a first bit-line coupled to the non-selected memory cell 400, applying a second voltage to a second word-line to provide a substantially conductive path between a charge storage element of a selected memory cell of the row and a second bit-line 410, comparing a level of charge of the first bit-line with a level of charge of the second bit-line 420, and outputting a voltage selected in response to said comparing 440. Applying a first voltage to a first word-line to maintain a substantially non-conductive barrier between a charge storage element of a non-selected memory cell of a row of memory cells and a first bit-line coupled to the non-selected memory cell 400 may apply a voltage to a gate of one or more transistors of memory elements. The transistors may act like switches that maintain the charge in the memory element when the transistor is off and that provide an electrical path for a charge stored in the memory element to a corresponding bit-line when the transistor is on. When a hard off is desirable, some embodiments may apply a negative voltage to the gate of non-selected memory cells within a memory bank being accessed. Other embodiments apply a low circuit voltage such as $V_{SS}$ or a high circuit voltage such as $V_D$.

Applying a first voltage to a first word-line to maintain a substantially non-conductive barrier between a charge storage element of a non-selected memory cell of a row of memory cells and a first bit-line coupled to the non-selected memory cell 400 may comprise selecting the word-line coupled to the non-selected memory cell from a set of word-lines coupled to the row of memory cells 405. Selecting the word-line coupled to the non-selected memory cell from a set of word-lines coupled to the row of memory cells 405 may select a word-line coupled to the row of memory cells in the bank that comprises the selected memory cell. Applying a voltage to the second word-line may attenuate any leakage that may be caused by applying a voltage to the reference bit-line during the write-back phase of evaluating the selected memory cell. For example, when memory cells comprise a transistor as an access element and a capacitor as a storage element, such as DRAM, sensing the selected memory cell may comprise sensing all the memory cells in the same group as the selected memory cell or coupled to the same word-line of the set of word-lines as the selected memory cell. The capacitor of each memory cell discharges substantially all of the charge stored in the corresponding memory elements so the charge may be restored during a write-back phase. The write-back phase may apply a charge differential between the reference bit-line and the signal bit-line to restore the charge. The charge applied to the reference bit-line, a bit-line coupled to a non-selected memory cell, may cause the non-selected memory cell to leak charge when the memory cell is not turned off effectively.

Applying a second voltage to a second word-line to provide a substantially conductive path between a charge storage element of a selected memory cell of the row and a second bit-line 410 may select the row comprising the selected memory cell, select the word-line of the set of word-lines coupled to the row that is also coupled to the selected memory cell, and apply a voltage to the word-line, applying a gate voltage to every memory cell coupled to the word-line. The gate voltage may be designed to turn on an access transistor for the memory cell such that a conductive path is formed between the memory element of the memory cell and the bit-line coupled to the memory cell. The conductive path may allow the charge stored in the memory element to discharge on to the bit-line for comparison of the signal bit-line with the reference bit-line.

Applying a second voltage to a second word-line to provide a substantially conductive path between a charge storage element of a selected memory cell of the row and a second bit-line 410 may comprise selecting a set of word-lines coupled to the row and selecting the second word-line from the set of word-lines 415. In many embodiments, selecting the memory cell to be evaluated may comprise decoding an address to determine the memory bank comprising the selected memory cell, decoding an address to determine the row comprising the selected memory cell and decoding an address to determine the bit-lines coupled to the group of memory cells comprising the selected memory cell. After determining the bit-lines associated with the group, a voltage may also be applied to the bit-line to enable the memory cells to be sensed.

Some embodiments apply a pre-charge to the bit-lines coupled to the group, as well as the reference bit-lines. For instance, some embodiments store approximately a positive or negative $V_D/2$ to indicate a high or low bit so the signal bit-lines may be pre-charged to approximately $V_D/2$ to combine with the charge in a memory element, pulling up the signal bit-line to approximately $V_D$ or pulling down the signal bit-line to approximately $V_{SS}$. The resulting charge on the signal bit-line may not be exactly $V_D$ or $V_{SS}$ because of several factors such as charge leakage from the memory element, tolerances in the writing circuitry, tolerances in a voltage limiter for the circuitry, current-resistance (IR) losses, and so on. Thus, comparing a level of charge of the first bit-line with a level of charge of the second bit-line 420 may be designed to account for a tolerance in the resulting level of charge on the signal bit-line.

Comparing a level of charge of the first bit-line with a level of charge of the second bit-line 420 may account for a tolerance in a resulting charge on the signal bit-line by determining the charge conveyed within a range of charge and amplifying the charge to $V_D$ or $V_{SS}$. Embodiments may determine the charge stored on the capacitor of the selected memory cell to determine whether the selected memory cell stores a logical 1 or a logical 0. For instance, comparing a level of charge of the first bit-line with a level of charge of the second bit-line 420 may comprise comparing a charge from the charge storage element of the selected memory cell combined with a pre-charge on the second bit-line against a pre-charge on the first bit-line 425. These embodiments may store a positive or negative $V_D/2$ so the data may be discernable as long as sufficient positive charge or negative charge is available to be sensed. Further, by placing a pre-charge on the reference bit-line and a pre-charge on a signal bit-line, wherein the signal bit-line and reference bit-line are physically close, differences in the pre-charge signals between the two lines may be insignificant or indiscernible. Thus, after a charge is combined with the pre-charge on the signal bit-line, the sensing circuitry, such as a sense amplifier, may determine whether the charge on the signal bit-line is higher or lower than the charge on the reference bit-line.

Determining whether the charge on the signal bit-line is higher or lower than the charge on the reference bit-line may be affected by noise such as capacitive coupling between signal bit-lines. When physically adjacent memory cells of a group of memory cells are being sensed, a signal bit-line may be pulled up or pulled down by neighboring bit-lines so many embodiments increase the distance between bit-lines and do this without using additional semiconductor area. Some of these embodiments may increase the distance between neighboring bit-lines by placing adjacent bit-lines in different conductive layers. For instance, a selected memory cell may be coupled to a bit-line in a first conductive layer such as metal layer one and the neighboring memory cell may be coupled to a bit-line in a second conductive layer such as metal layer three.

Comparing a charge from the charge storage element of the selected memory cell combined with a pre-charge on the second bit-line against a pre-charge on the first bit-line 425 may comprise writing-back a voltage to the second memory cell by applying a voltage to the second bit-line and a corresponding voltage to the first bit-line 430. Writing-back a voltage to the second memory cell by applying a voltage to the second bit-line and a corresponding voltage to the first bit-line 430 may comprise amplifying a voltage differential between a signal bit-line and a reference bit-line caused by a discharge of the capacitor of the selected memory cell to facilitate storing the binary information sensed from the capacitor in a register or output buffer and refreshing the selected memory cell. Amplifying the voltage differential may comprise selecting $V_D$ or $V_{SS}$ based on a determination of whether a charge stored a selected memory cell is positive or negative. In many embodiments, a group of memory cells comprising the selected memory cell discharges to bit-lines so circuitry for each memory cell may amplify the respective charges.

Refreshing the selected memory cell may restore the charge representing binary information in the memory element of a memory cell after the memory cell has been sensed. In many embodiments, after the memory cell is sensed the charge stored in the capacitor of the memory cell may be substantially depleted so refreshing the selected memory cell may maintain the binary information in the selected memory cell. Refreshing the selected memory cell may comprise applying the amplified voltage differential sensed from the selected memory cell to the bit-line of the selected memory cell. Refreshing the selected memory cell may also comprise applying the negative of the amplified voltage differential on a bit-line of a non-selected cell. Applying the negative of the amplified voltage differential on a bit-line of a non-selected cell may apply a voltage opposite of that used to refresh the selected memory cell to a reference bit-line coupled to a non-selected memory cell.

After amplifying the difference between the charge on the signal bit-line and the charge on the reference bit-line, an embodiment may comprise outputting a voltage selected in response to said comparing 440. Outputting a voltage selected in response to said comparing 440 may couple the amplified voltage, e.g. $V_D$ or $V_{SS}$, to an output circuit to provide the signal as data to an external circuit. Many embodiments comprise a buffer or register to store the data while sensing additional memory cells. In some embodiments, outputting a voltage selected in response to said comparing 440 may independently output voltages representing data in more than one memory cell substantially simultaneously.

In some embodiments, selecting a memory cell of a row of memory cells coupled to a set of word-lines may comprise selecting every other or every third, or every fourth memory cell of a row when the set of word-lines comprises two, three or four word-lines, respectively. Further, sensing the selected memory cell may comprise sensing more than one selected memory cell or sensing a group of selected memory cells. In alternate embodiments, refreshing the selected memory cell may comprise applying the negative of the amplified voltage differential on a bit-line of a non-selected cell.

Figure 5:
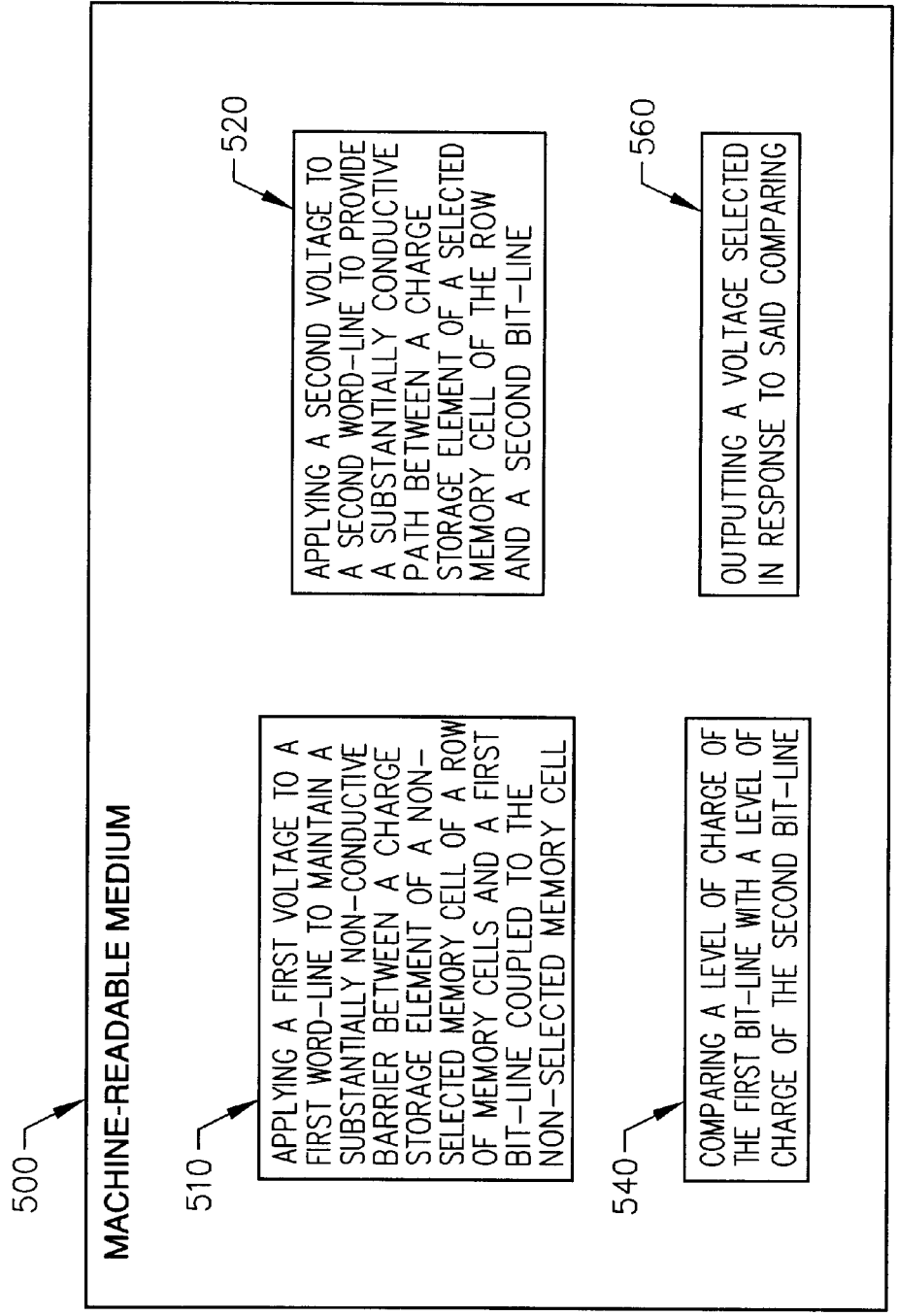
FIG. 5 depicts a machine-readable medium comprising instructions to access multiple-word-line memory.

Referring now to FIG. 5, a machine-readable medium embodiment of the present invention is shown. A machine-readable medium includes any mechanism that provides (i.e. stores and or transmits) information in a form readable by a machine (e.g., a computer), that when executed by the machine, can perform the functions described herein. For example, a machine-readable medium may include read only memory (ROM); random access memory (RAM); magnetic disk storage media; optical storage media; flash memory devices; electrical, optical, acoustical or other form of propagated signals (e.g. carrier waves, infrared signals, digital signals, etc.); etc. . . . Several embodiments of the present invention can comprise more than one machine-readable medium depending on the design of the machine.

The machine-readable medium 500 may comprise instructions for applying a first voltage to a first word-line to maintain a substantially non-conductive barrier between a charge storage element of a non-selected memory cell of a row of memory cells and a first bit-line coupled to the non-selected memory cell 510, applying a second voltage to a second word-line to provide a substantially conductive path between a charge storage element of a selected memory cell of the row and a second bit-line 520, comparing a level of charge of the first bit-line with a level of charge of the second bit-line 540, and outputting a voltage selected in response to said comparing 560. Applying a first voltage to a first word-line to maintain a substantially non-conductive barrier between a charge storage element of a non-selected memory cell of a row of memory cells and a first bit-line coupled to the non-selected memory cell 510 may comprise instructions for selecting a group of memory cells on a row defined by a set of word-lines by applying a voltage to one word-line of the set of word-lines. Applying a first voltage to a first word-line to maintain a substantially non-conductive barrier between a charge storage element of a non-selected memory cell of a row of memory cells and a first bit-line coupled to the non-selected memory cell 510 may prevent a charge from a non-selected memory cell from discharging or limit the amount of discharging as a result of voltages and/or noise within the memory bank. Discharging may be prevented or limited by applying a voltage to the gate of an access transistor, for example, to substantially block a conductive path from forming in the channel of the transistor between the memory element and the bit-line coupled to the memory cell.

Applying a second voltage to a second word-line to provide a substantially conductive path between a charge storage element of a selected memory cell of the row and a second bit-line 520 may comprise instructions to couple a capacitance of a memory cell to a bit-line by providing a conductive path through the channel or substrate of a transistor of the memory cell. Many embodiments comprise instructions for decoding of an address to determine the memory bank, row of the memory bank, and group comprising the selected memory cell(s) to select the set of word-lines within the memory bank and the word-line(s) within the set of word-lines that couples to the selected memory cell(s). Further, the bit-lines coupled to the group(s) comprising the selected memory cell(s) may be pre-charged via sense amplifiers to enable access transistors and to reduce the current expended by the memory array during evaluation of the selected memory cell(s).

Comparing a level of charge of the first bit-line with a level of charge of the second bit-line 540 may comprise instructions for channeling the voltage of the signal bit-line coupled to the selected memory cell and the reference bit-line coupled to the non-selected memory cell to a comparator circuit in a sense amplifier. The comparator circuit may be instructed to compare the difference in charge associated with the two bit-lines and to select a voltage to represent the data stored in the selected memory cell. In some embodiments, instructions for comparing or to operate the comparator circuit may comprise instructions for delaying selection of a voltage until a threshold charge difference is realized or for operating hysteresis circuitry to select the voltage. For example, the comparator circuit may first compare the difference between the pre-charge on the reference bit-line and the pre-charge on the signal bit-line. Differences between losses in the reference bit-line and the signal bit-line, as well as noise from capacitive coupling within the memory array or switching in the peripheral circuitry may cause the difference between the signal bit-line and the reference bit-line to switch between positive and negative or to indicate false data. After a conductive path between a memory element and a signal bit-line is formed, a charge of the memory element may slowly combine with the pre-charge on the signal bit-line, so until sufficient charge from the memory element has combined with the charge on the signal bit-line, the comparator may receive changing differences in charge. Therefore, the instructions for delaying or for operating the hysteresis circuitry may prevent the selection of a voltage until a sufficient charge differential is sensed.

After selecting a voltage in response to the comparison, the embodiment may comprise instructions for writing-back the selected voltage to the selected memory cell. Writing-back the selected voltage to the selected memory cell may comprise instructions for charging the selected memory cell with the selected voltage. A sense amplifier, in many embodiments, may apply the selected voltage to the signal bit-line coupled to the selected memory cell so the charge discharged from the selected memory cell is replaced with a substantially equivalent charge. In some embodiments, instructions for writing-back the selected voltage may comprise applying a second voltage, sometimes the negative of the selected voltage, to the reference bit-line coupled to a non-selected memory cell.

Several embodiments comprise instructions for outputting a voltage selected in response to said comparing 560. Outputting a voltage selected in response to said comparing 560 may comprise instructions to provide a conductive path from one or more sense amplifiers coupled to selected memory cell(s) to one or more outputs or output buffer(s). Output buffers or registers may facilitate burst reads, allowing data from multiple reads to be forwarded to a requesting device, such as the core of a processor or a peripheral device, within one or more transactions. In some embodiments, instructions to operate the buffers or registers may further facilitate transactions over a bus that may operate at a clock speed that is slower than the clock speed used to access the memory cells or facilitate transactions with a requesting device that may operate at a different clock speed than the clock speed used to access the memory cells.

In alternative embodiments, the instructions for delaying or for operating hysteresis circuitry may trigger an output circuit such that instructions for comparing a level of charge of the first bit-line with a level of charge of the second bit-line 540 comprises instructions to output the selected or amplified voltage.

What is claimed is:

1. An apparatus, comprising:
a memory comprising
a first sense amplifier coupled to first and second bit lines;
a second sense amplifier coupled to third and fourth bit lines;
a third sense amplifier coupled to fifth and sixth bit lines;
a fourth sense amplifier coupled to seventh and eighth bit lines;
a first memory cell coupled between the third bit line and a first word line;
a second memory cell coupled between the fourth bit line and a second word line;
wherein the second, sixth, and eighth bit lines are disposed between the third and fourth bit lines.

2. The apparatus of claim 1, wherein the third and fourth bit lines are in different conductive layers.

3. The apparatus of claim 2, wherein the different conductive layers have at least one other conductive layer between them.

4. The apparatus of claim 1, further comprising a first set of multiple memory cells coupled to the first word line and a second set of multiple memory cells coupled to the second word line.

5. The apparatus of claim 1, wherein the first word-line has a first portion disposed in a first metalization layer and a second portion disposed in a second metalization layer.

6. The apparatus of claim 1, wherein:
the third bit line is to be used as a signal line and the fourth bit line is to be used as a reference line responsive to the first memory cell being selected; and
the third bit line is to be used as a reference line and the fourth bit line is to be used as a signal lines responsive to the second memory cell being selected.

7. The apparatus of claim 1, wherein:
the first word-line is coupled to two groups of four memory cells and a group of eight memory cells; and
the second word-line is coupled to two groups of eight memory cells separated by the group of eight memory cells.

8. The apparatus of claim 1, wherein the first word-line is separated from the second word-line by a substantially non-conductive layer.

9. The apparatus of claim 1, wherein the first and second word-lines comprise a vertical twist between the first memory cell and the second memory cell.

10. The apparatus of claim 1, wherein the second sense amplifier is to compare a voltage on one of the third and fourth bit lines with a voltage on the other of the third and fourth bit lines.

11. The apparatus of claim 1, further comprising circuitry to evaluate adjacent memory cells substantially simultaneously.

12. The apparatus of claim 1, wherein the sense amplifiers are spaced at quarter pitch.

13. A system, comprising:
a processor;
a memory controller coupled to the processor; and
a memory device coupled to the memory controller comprising
a first sense amplifier coupled to first and second bit lines;
a second sense amplifier coupled to third and fourth bit lines;
a third sense amplifier coupled to fifth and sixth bit lines;
a fourth sense amplifier coupled to seventh and eighth bit lines;
a first memory cell coupled between the third bit line and a first word line;
a second memory cell coupled between the fourth bit line and a second word line;
wherein the second, sixth, and eighth bits lines are disposed between the third and fourth bit lines.

14. The system of claim 13, further comprising static random access memory coupled to the memory controller to store frequently accessed data.

15. The system of claim 13, wherein the third and fourth bit-lines are in different conductive layers.

16. The system of claim 13, wherein:
the third bit line is to be used as a signal line and the fourth bit line is to be used as a reference line responsive to the first memory cell being selected; and
the third bit line is to be used as a reference line and the fourth bit line is to be used as a signal lines responsive to the second memory cell being selected.

17. The system of claim 13, wherein the sense amplifiers are spaced at quarter pitch.

18. The system of claim 13, wherein the first and second memory cells are coupled to bit-lines in different conductive layers.

19. The system of claim 13, wherein the first and second sense amplifiers are at an opposite side of a memory bank from the third and fourth sense amplifiers.

* * * * *

UNITED STATES PATENT AND TRADEMARK OFFICE
CERTIFICATE OF CORRECTION

PATENT NO.   : 6,567,329 B2
DATED        : May 20, 2003
INVENTOR(S)  : Somasekhar et al.

It is certified that error appears in the above-identified patent and that said Letters Patent is hereby corrected as shown below:

<u>Column 2,</u>
Line 10, after the word "elements", delete "." and insert -- : --.

<u>Column 6,</u>
Line 23, in the second occurrence of the phrase "word-lines", delete "Word" and insert -- word --.

Signed and Sealed this

Second Day of December, 2003

JAMES E. ROGAN
*Director of the United States Patent and Trademark Office*